United States Patent
Radosavljevic et al.

(10) Patent No.: US 11,710,765 B2
(45) Date of Patent: Jul. 25, 2023

(54) HIGH ASPECT RATIO NON-PLANAR CAPACITORS FORMED VIA CAVITY FILL

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/724,152

(22) Filed: Apr. 19, 2022

(65) Prior Publication Data

US 2022/0246717 A1  Aug. 4, 2022

Related U.S. Application Data

(63) Continuation of application No. 16/636,876, filed as application No. PCT/US2017/053347 on Sep. 26, 2017, now Pat. No. 11,362,172.

(51) Int. Cl.
*H01L 49/02* (2006.01)

(52) U.S. Cl.
CPC .................. *H01L 28/91* (2013.01)

(58) Field of Classification Search
CPC ..................................................... H01L 28/56
See application file for complete search history.

(56) References Cited

U.S. PATENT DOCUMENTS

| | | | |
|---|---|---|---|
| 1,183,559 | A | 5/1916 | Hedley et al. |
| 9,711,352 | B2 | 7/2017 | Han et al. |
| 10,497,785 | B2 | 12/2019 | Dasgupta et al. |
| 10,658,471 | B2 | 5/2020 | Dasgupta et al. |
| 2016/0027636 | A1 | 1/2016 | Han et al. |
| 2017/0018640 | A1 | 1/2017 | Then et al. |
| 2018/0350921 | A1 | 12/2018 | Dasgupta et al. |
| 2019/0058041 | A1 | 2/2019 | Dasgupta et al. |
| 2020/0168708 | A1 | 5/2020 | Radosavljevic et al. |

*Primary Examiner* — John A Bodnar
(74) *Attorney, Agent, or Firm* — Akona IP

(57) ABSTRACT

A method for forming non-planar capacitors of desired dimensions is disclosed. The method is based on providing a three-dimensional structure of a first material over a substrate, enclosing the structure with a second material that is sufficiently etch-selective with respect to the first material, and then performing a wet etch to remove most of the first material but not the second material, thus forming a cavity within the second material. Shape and dimensions of the cavity are comparable to those desired for the final non-planar capacitor. At least one electrode of a capacitor may then be formed within the cavity. Using the etch selectivity of the first and second materials advantageously allows applying wet etch techniques for forming high aspect ratio openings in fabricating non-planar capacitors, which is easier and more reliable than relying on dry etch techniques.

20 Claims, 13 Drawing Sheets

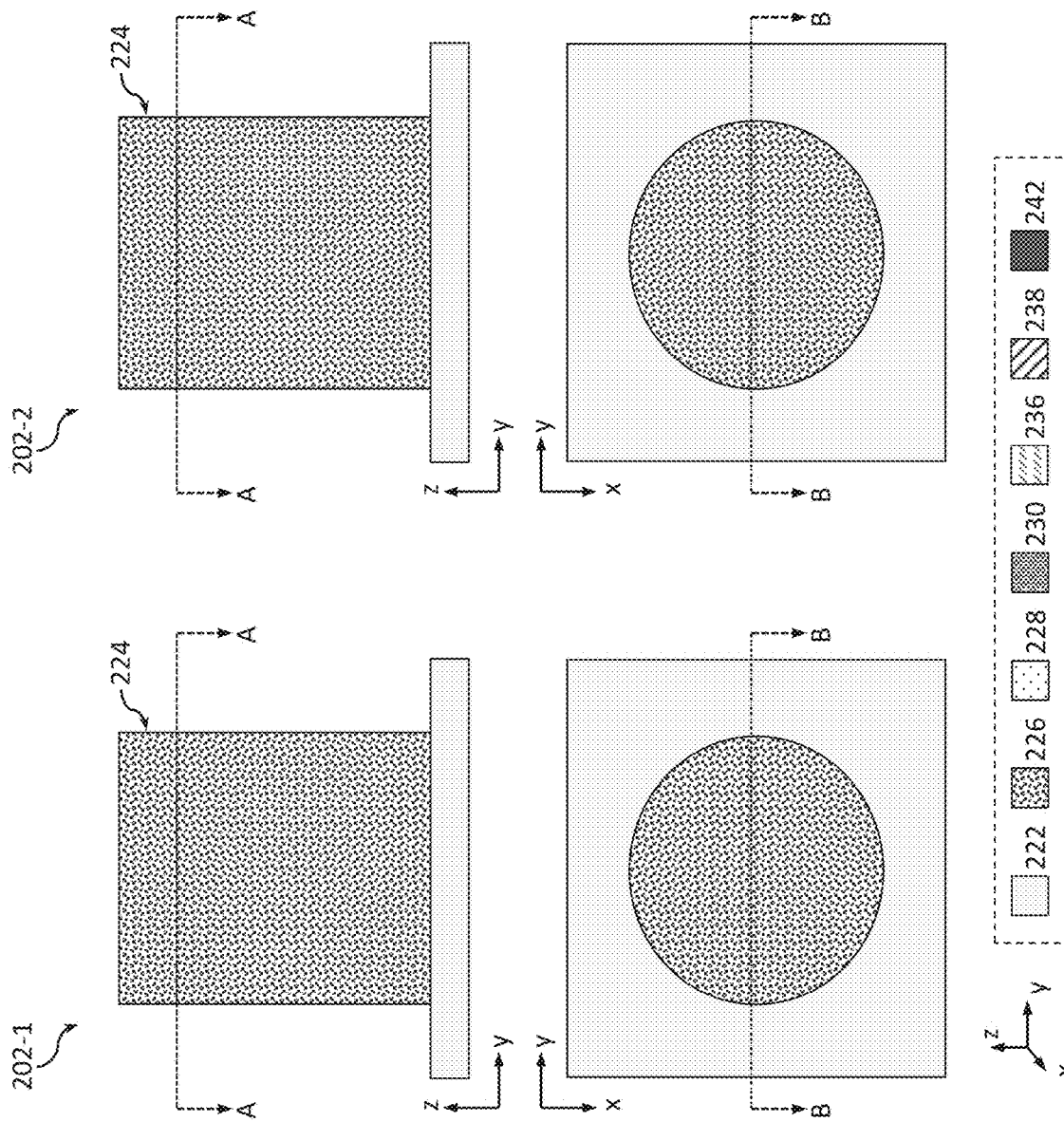

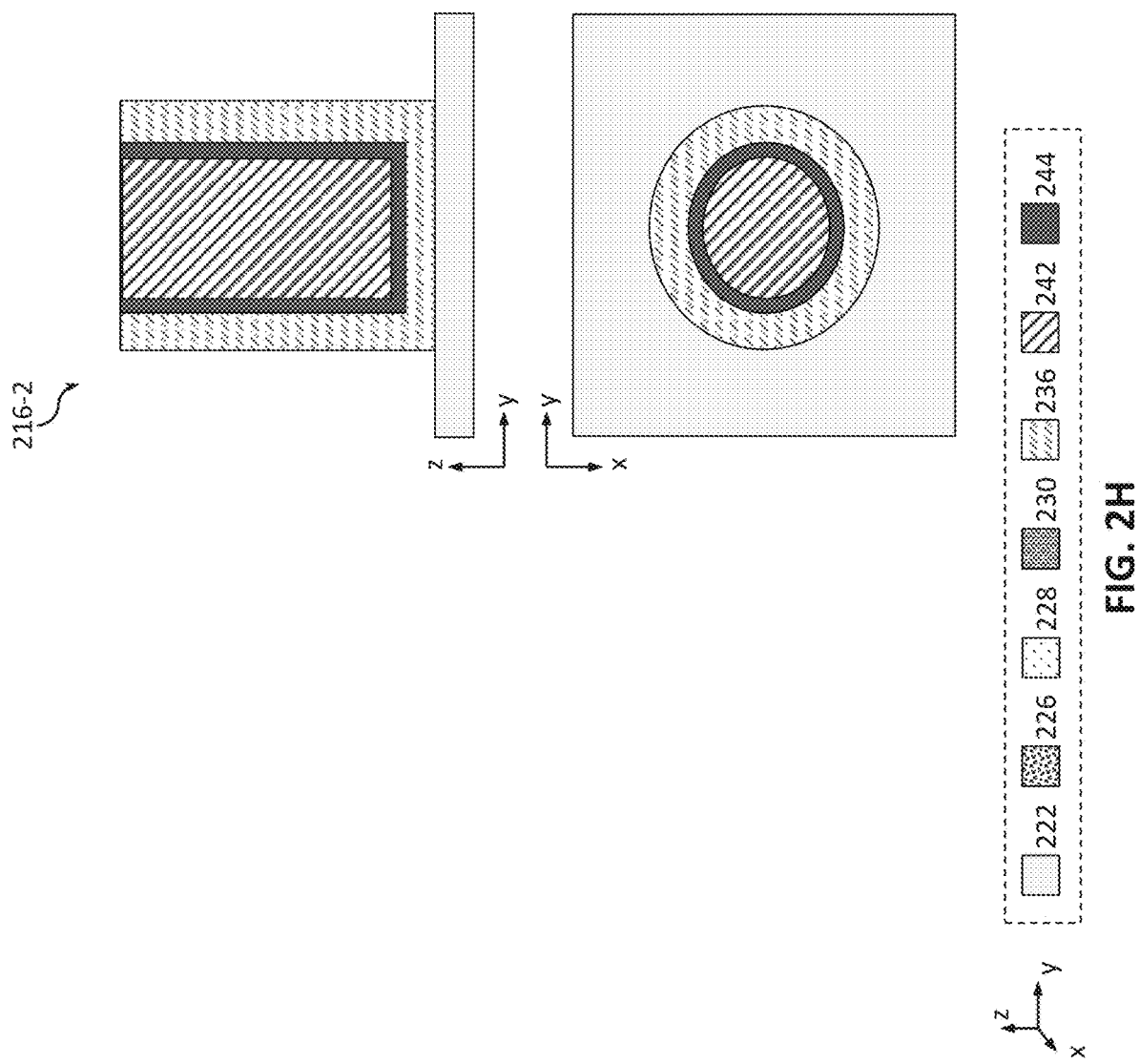

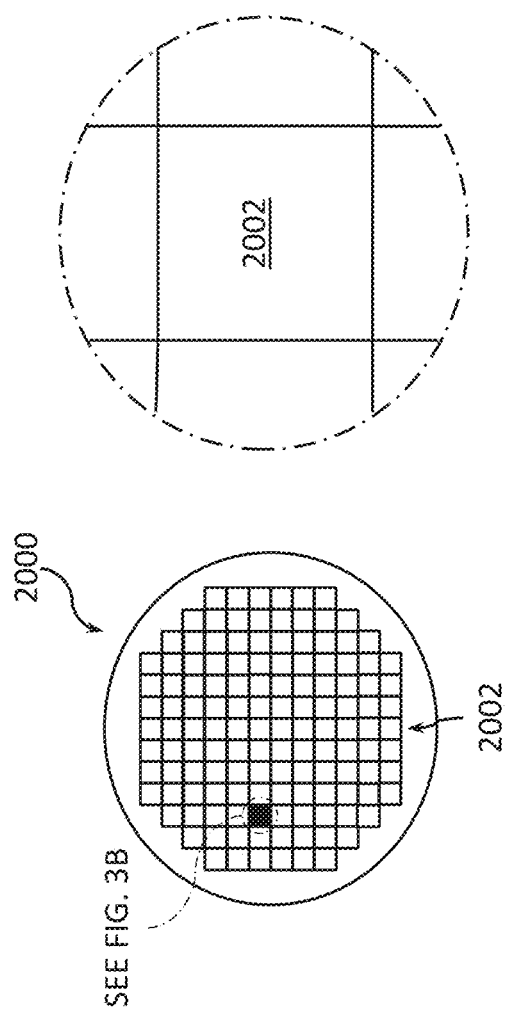

HIGH ASPECT RATIO NON-PLANAR CAPACITORS FORMED VIA CAVITY FILL

CROSS-REFERENCE TO RELATED APPLICATIONS

This application is a continuation (and claims benefit of priority under 35 U.S.C. § 120) of U.S. application Ser. No. 16/636,876, filed Feb. 5, 2020, entitled "HIGH ASPECT RATIO NON-PLANAR CAPACITORS FORMED VIA CAVITY FILL," which is a national stage application under 35 U.S.C. § 371 of PCT International Application No. PCT/US2017/053347, filed on Sep. 26, 2017 and entitled "HIGH ASPECT RATIO NON-PLANAR CAPACITORS FORMED VIA CAVITY FILL," which are hereby incorporated by reference herein in their entirety.

TECHNICAL FIELD

This disclosure relates generally to the field of semiconductor devices, and more specifically, to non-planar capacitors for electronic device components, as well as methods for forming such capacitors.

BACKGROUND

High-breakdown capacitors are of great importance in various modern technologies, such as e.g. memories and radio frequency (RF) power amplifiers. The name "high-breakdown" arises from the fact that such capacitors have an enhanced breakdown voltage, i.e. voltage at which electrical current starts flowing through capacitor's insulator layer that separates the two capacitor's electrodes, an undesirable phenomenon that can cause failure of electronic devices which include such capacitors.

Capacitors implementing non-planar architectures, e.g. cylindrical capacitors, and high aspect ratio (AR) openings (i.e. ratios of a height of an opening to a width of an opening) are particularly suitable for realizing the high-breakdown requirement. However, fabricating such capacitors remains a challenge because conventional fabrication approaches rely on dry etch to form large capacitors with high AR openings, which is not easy to do. Hence, improvements in this respect would be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2H illustrate various stages in the manufacture of non-planar capacitor device assemblies using the method shown in FIG. 2 in accordance with two exemplary embodiments of the present disclosure.

FIGS. 3A and 3B are top views of a wafer and dies that include one or more non-planar capacitors formed using the cavity fill method in accordance with any of the embodiments disclosed herein.

DETAILED DESCRIPTION

Figure 1:
FIG. 1 is a flow diagram of an exemplary method for manufacturing a non-planar capacitor device assembly using cavity fill, in accordance with various embodiments of the present disclosure.

Disclosed herein is a cavity fill method for forming non-planar capacitors of desired dimensions, as well as some exemplary device assemblies which include such capacitors. The method is based on providing a three-dimensional (3D) structure of a first material over a substrate, enclosing the structure with a second material that is sufficiently etch-selective with respect to the first material, and then performing wet etch to remove most of the first material but substantially none of the second material, thus forming a cavity within the second material. Shape and dimensions of the cavity are comparable to those desired for the final non-planar capacitor. At least one electrode of a capacitor may then be formed within the cavity, which gives rise to the term "cavity fill" used herein to refer to such a method of forming capacitors. Using the etch selectivity of the first and second materials advantageously allows applying wet etch techniques for forming high AR openings in fabricating capacitors, which is easier and more reliable than utilizing dry etch techniques.

As known in the art, two materials are said to have "sufficient etch selectivity" when etchants used to etch one material do not substantially etch the other, enabling selective etching of one material but not the other.

Since most of the first material is removed, the first material is referred to herein as a "sacrificial material." Since the second material serves as a shell, i.e. a solid outer case inside which a cavity can be formed, the second material is referred to herein as a "shell material."

Another aspect of the present disclosure provides an exemplary device assembly that includes a substrate and a non-planar capacitor formed over the substrate using the cavity fill method described herein. The capacitor includes a first electrode and a second electrode, shaped as cylinders or prisms, the latter possibly with rounded corners, extending away from the substrate and being substantially perpendicular to the substrate, and a capacitor insulator provided between the first and second electrodes. The first capacitor electrode is encompassed (i.e. surrounded) by a dielectric stack comprising a layer of a first dielectric material and a layer of a second dielectric material, different from the first dielectric material, the second dielectric material including, or being a compound of, aluminum and nitrogen, e.g. the second dielectric material including or being aluminum nitride (AlN). Such a second dielectric material of the dielectric stack encompassing the first electrode of the capacitor is the shell material employed in the cavity fill method, while the first dielectric material is a version of the sacrificial material employed in the cavity fill method modified (namely, hardened, as described in greater detail below) due to the deposition of the shell material onto it.

Non-planar capacitors formed via cavity fill as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as memories, amplifiers, microprocessors, optoelectronics, logic blocks, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced. The accompanying drawings are not necessarily drawn to scale. For example, to clarify various layers, structures, and regions, the thickness of some layers may be enlarged. Furthermore, while drawings illustrating various structures/assemblies of exemplary devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g. scanning electron microscopy (SEM) or transmission electron microscopy (TEM). In addition, the various structures/assemblies of the present drawings may further include possible processing defects, such as e.g. the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g. a layer, film, area, or plate) is in any way positioned on or over (e.g. positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. In some examples, as used herein, a "high-k dielectric" refers to a material having a higher dielectric constant than silicon oxide, while the terms "oxide," "carbide," "nitride," etc. refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function.

FIG. 1 is a flow diagram of an example method 100 for manufacturing a non-planar capacitor device assembly using cavity fill, in accordance with various embodiments of the present disclosure. Device assemblies in various example stages during the manufacture using the method 100 are illustrated in FIGS. 2A-2H, in accordance with some embodiments of the present disclosure. In particular, each of FIGS. 2A-2H illustrates two alternative embodiments for an exemplary device assembly after a respective process of the method 100 shown in FIG. 1 has been performed. Namely, the two left-most illustrations of each of FIGS. 2A-2H are, respectively, a cross-sectional and a top view of the assembly according to a first embodiment of the present disclosure, while the two right-most illustrations of each of FIGS. 2A-2H are, respectively, a cross-sectional and a top view of the assembly according to a second embodiment of the present disclosure. With reference to the x-y-z coordinate system shown at the bottom of FIGS. 2A-2H, the top view for each of the two embodiments is the view in the z-y plane, while the bottom view for each of the two embodiments is the view in the x-y plane. In other words, in each of FIGS. 2A-2H, the bottom view is a cross-section along the plane A-A of the top view, while the top view is a cross-section of the respective assembly along the plane B-B of the bottom view, where dashed lines A-A and B-B are applicable to each of FIGS. 2A-2H but are only shown for FIG. 2A (in order to not clutter other drawings) and are intended to illustrate planes which include those lines and are perpendicular to the plane of the drawings.

A number of elements referred to in the description of FIGS. 2A-2H with reference numerals are indicated in these FIGS. with different patterns in order to not clutter the drawings, with a legend at the bottom of FIGS. 2A-2H showing the correspondence between the reference numerals and the patterns.

Various operations of the method 100 may be illustrated in FIGS. 2A-2H with some exemplary assemblies and explained with reference to some exemplary embodiments discussed below, but the method 100 may be used to manufacture any suitable device assemblies with non-planar capacitors according to any embodiments of the present disclosure. In addition, although the operations of the method 100 are illustrated in FIG. 1 once each and in a particular order, the operations may be performed in any suitable order and repeated as desired. For example, one or more operations may be performed in parallel to manufacture multiple device assemblies with non-planar capacitors as described herein substantially simultaneously. In another example, the operations may be performed in a different order to reflect the architecture of a particular device component in which one or more non-planar capacitors as described herein are to be included.

In addition, the manufacturing method 100 may include other operations, not specifically shown in FIG. 1, such as e.g. various cleaning operations as known in the art. For example, in some embodiments, the device assembly may be cleaned prior to or/and after any of the processes of the method 100 described herein, e.g. to remove surface-bound organic and metallic contaminants, as well as subsurface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)).

As shown in FIG. 1, the method 100 may begin with a process 102 that includes providing over a portion of a substrate a three-dimensional structure of a sacrificial material. An exemplary result of the process 102 is illustrated with a device assembly 202-1 and a device assembly 202-2 shown in FIG. 2A for the first and second embodiments, respectively, where a substrate 222 is shown to have a structure 224 of a sacrificial material 226 formed therein.

The substrate 222 may be any substrate on which devices as described herein may be implemented. In some embodiments, the substrate 222 may include a semiconductor, such as silicon. In other implementations, the semiconductor substrate may be formed using alternate materials, which may or may not be combined with silicon, that include but are not limited to germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Although a few examples of materials from which the substrate may be formed are described here, any material that may serve as a foundation upon which a semiconductor device may be built falls within the spirit and scope of the present disclosure. In some embodiments, the substrate 222 may be a crystalline substrate. In other embodiments, the substrate 222 may be non-crystalline.

Figure 2B:
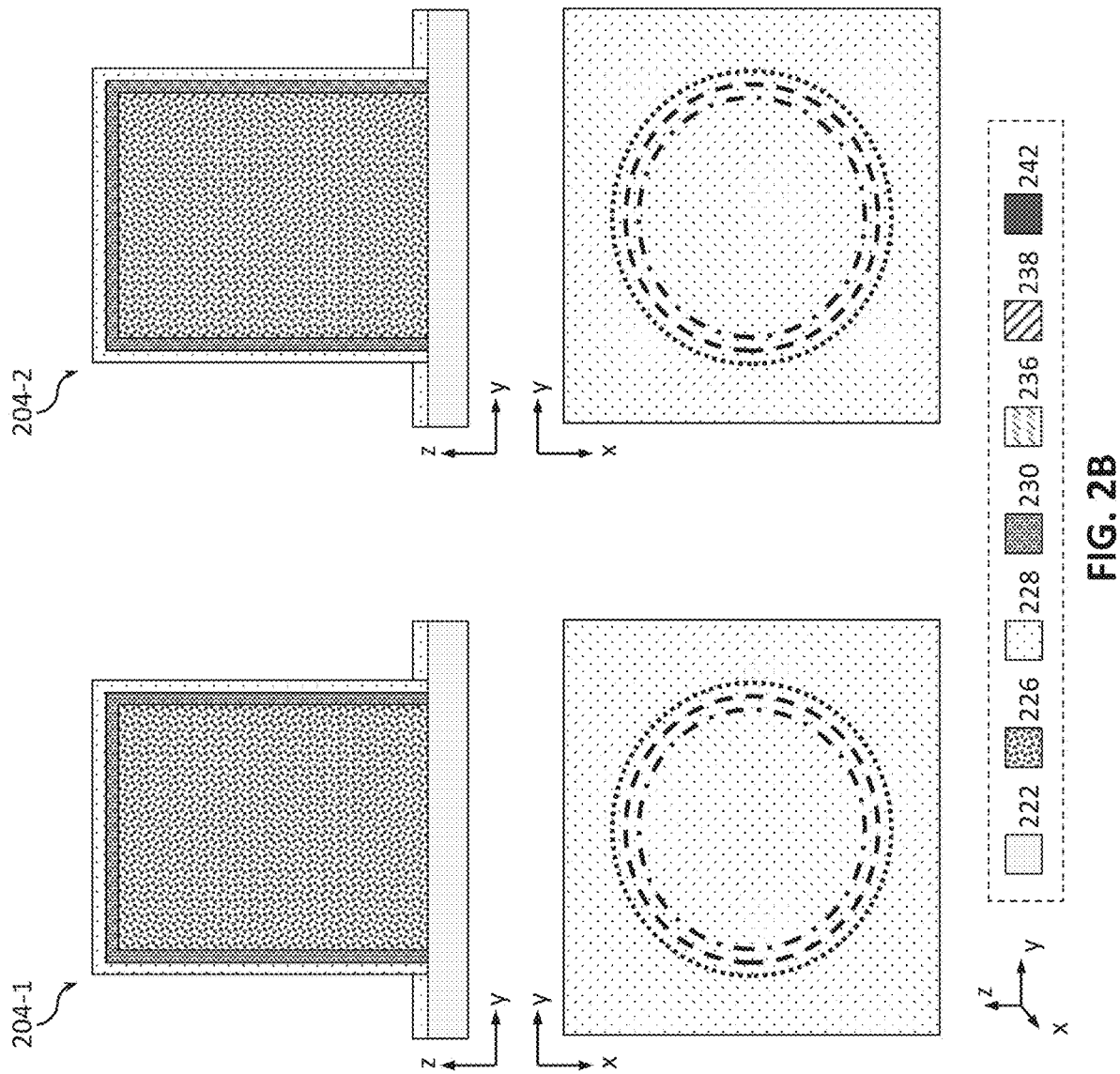

The structure 224 formed in the process 102 is shown in the shape of a cylinder for both embodiments shown in FIG. 2A and, consequently, for both embodiments shown in FIGS. 2B-2H. However, in other implementations, the structure 224 for FIGS. 2A-2H may be in the shape of a prism instead.

The shape and dimensions of the structure formed in the process 102 should be selected appropriately keeping in mind that the shape and dimensions of this structure will later define the shape and dimensions of at least a first electrode of the final non-planar capacitor, described in greater detail below. For example, in different implementations of the device assembly 202-1 of the first embodiment shown in FIGS. 2A-2H, the height of the structure 224 (i.e. a dimension measured along the z-axis of the coordinate system shown in FIGS. 2A-2H) provided in the process 102 may be between about 100 and 5000 nanometers (nm), including all values and ranges therein, e.g. between about 200 and 3000 nm, or between about 500 and 2000 nm, while the width of the structure 224 (i.e. a dimension measured along the y-axis of the coordinate system shown in FIGS. 2A-2H) may be between about 5 and 50 nm, including all values and ranges therein, e.g. between about 10 and 40 nm, or between about 20 and 30 nm. In different implementations of the device assembly 202-2 of the second embodiment shown in FIGS. 2A-2H, the height of the structure 224 provided in the process 102 may be between about 100 and 5000 nm, including all values and ranges therein, e.g. between about 200 and 3000 nm, or between about 500 and 2000 nm, while the width of the structure 224 may be between about 30 and 150 nm, including all values and ranges therein, e.g. between about 40 and 100 nm, or between about 50 and 80 nm.

The sacrificial material 226 may include any material that has sufficient etch selectivity with respect to the shell material deposited around the structure of the sacrificial material 226 in a later process (process 104, described below) and with respect to the substrate 222 (in order to not avoid substrate undercutting when the sacrificial material 226 is etched at a later process 108, described below). Besides appropriate etching characteristics, some other considerations in selecting a suitable material for forming the structure 224 may include e.g. possibilities of smooth film formation, low shrinkage and outgassing, and good dielectric properties (such as e.g. low electrical leakage, suitable value of a dielectric constant, and thermal stability).

In some embodiments, the sacrificial material 226 may be a sacrificial dielectric material, such as e.g. any of the low-k or high-k dielectric materials as commonly used in semiconductor processing, including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the sacrificial material 226 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the sacrificial material 226 may include, but are not limited to, fluorine-doped silicon dioxide, carbon-doped silicon dioxide, spin-on organic polymeric dielectrics such as e.g. polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)).

Any suitable deposition techniques may be used to provide the structure 224, possibly in combination with patterning as known in the art. For example, techniques such as e.g. spin-coating, dip-coating, chemical vapor deposition (CVD), ALD, PECVD, or thermal oxidation may be used to provide the sacrificial material 226, while patterning techniques such as e.g. photolithographic or electron-beam patterning may be used to define the shape of the structure 224.

Next, the method 100 may proceed with a process 104 of enclosing the three-dimensional structure of the sacrificial material provided in the process 102 with a shell material. An exemplary result of the process 104 is shown in FIG. 2B with a device assembly 204-1 for the first embodiment and a device assembly 204-2 for the second embodiment, in each of which the structure 224 is shown to be enclosed completely with a shell material 228. In general, the shell material 228 may be any material within which a cavity can be formed in a later process by removing at least some of the sacrificial dielectric material 226 by wet etch (i.e. any material satisfying the etch selectivity considerations with respect to the sacrificial dielectric material 226, provided above). However, inventors of the present disclosure realized that a material that includes aluminum and nitrogen, e.g. aluminum nitride (AlN), may be particularly advantageous for use as the shell material 228, reasons for which are explained below.

It was realized that high temperature (i.e. temperatures of about 1000 degrees Celsius) deposition of AlN provides additional hardening to the sacrificial dielectric material 226 near the deposition of AlN, thus creating a liner of a hardened dielectric material which is etch-selective with respect to the original sacrificial dielectric provided as the structure 224 in the process 102. Each of the device assemblies 204-1 and 204-2 of FIG. 2B illustrates such a hardened dielectric liner 230 formed where the original sacrificial dielectric material 226 was and where the original sacrificial dielectric material 226 interfaced (i.e. was at a close proximity, preferably in contact with) the shell material 228. Each of the bottom views for both embodiments of FIG. 2B illustrates with a dotted line an outline of the structure 224 covered with the shell material 228 extending away from the substrate 222, illustrates with a dashed line an outline of the structure 224 underneath the shell material, and illustrates with a dashed-dotted line an outline of the original sacrificial dielectric material 226 that was not converted to the hardened dielectric liner 230.

In some embodiments, such a high temperature deposition of AlN may be performed by for metal organic chemical vapor deposition (MOCVD) or sputtered approaches. Similar to CVD or ALD, MOCVD is a chemical process in which one or more reactive precursor gases are introduced into a reaction chamber and directed towards a substrate in order to induce controlled chemical reactions that result in growth of a desired material on the substrate. In the chamber, a layer of solid thin-film material is deposited on the surface of the substrate due to reaction of the gas/gases. What is unique to MOCVD is that one or more precursors used are metal organic (MO) precursors, such as trimethyl-aluminum. The nitrogen may be provided using either NH3 or N2 gas. The reaction to grow AlN occurs at very high temperatures (greater than 1000 degrees Celsius) which is what results in changing of the originally deposited sacrificial dielectric 226 to the hardened dielectric 230. Sputtering approach to depositing AlN may involve performing physical vapor deposition (PVD) from an aluminum target in nitrogen gas ambient. Similar to MOCVD, such sputtering may be performed at temperatures greater than 1000 degrees Celsius, resulting in formation of the hardened dielectric 230 at the interfaces where AlN is deposited on the originally deposited sacrificial dielectric 226.

While FIG. 2B and subsequent FIGS. illustrate an embodiment where the hardened dielectric 230 is formed, in other embodiments, such a hardened dielectric material does not have to be formed as long as the shell material 228 and the sacrificial dielectric material 226 are selected so that it is possible to create a cavity in the shell material 228 in a later process (process 108, described below) by removing at least some of the sacrificial dielectric material 226. Furthermore, while FIG. 2B illustrates a substantially complete coverage of the structure 224, as well as the surrounding area of the substrate 222, by the shell material 228 because such implementation may be particularly advantageous from the fabrication perspective (e.g. because it's easier to cover the entire structure 224 in a single deposition process), in other implementations the shell material 228 does not cover the structure 224 completely, i.e. the shell material 228 may have discontinuities so that there may be one or more openings in the shell material 228 encompassing the structure 224, i.e. portions of the structure 224 may remain exposed through the shell material 228.

In various embodiments, the thickness of the shell material 228 provided in the process 108 may be between about 5 and 100 nm, including all values and ranges therein, e.g. between 20 and 80 nm, or between 50 and 75 nm. For the implementations when the hardened dielectric 230 is formed, a thickness of the hardened dielectric 230 may be between about 5 and 100 nm, including all values and ranges therein, e.g. between about 10 and 30 nm, or between about 15 and 20 nm.

Figure 2C:
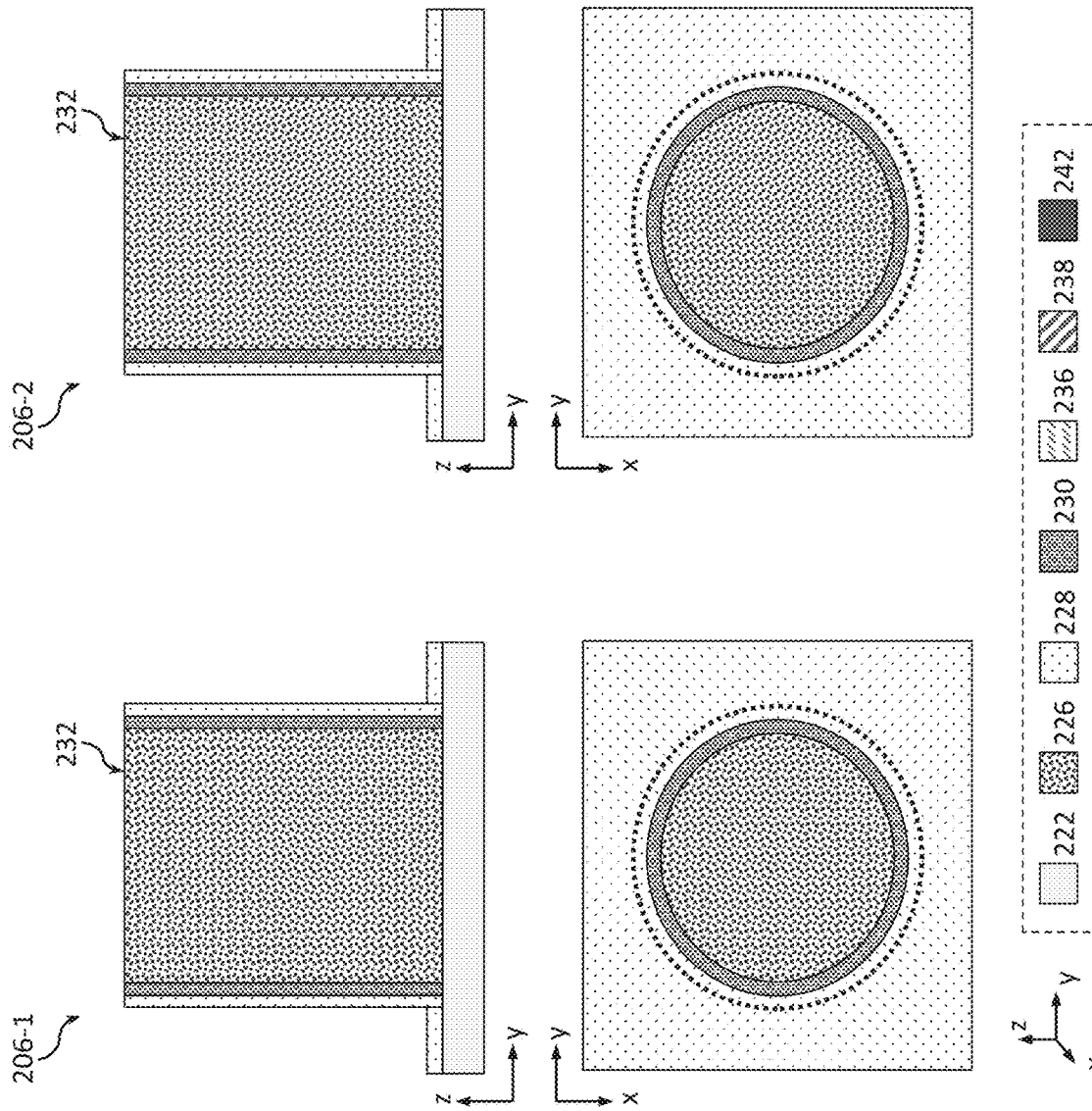

The method 100 may then proceed with a process 106 of creating an etch/deposition opening in the shell material (and in the hardened dielectric material, in case such a material was formed) for removing at least some of the sacrificial dielectric material of the structure 224 to form a cavity in a later process and for depositing other materials in the cavity thereafter. An exemplary result of the process 106 is illustrated in FIG. 2C with a device assembly 206-1 for the first embodiment and a device assembly 206-2 for the second embodiment, in each of which showing that the upper portions of the shell material 228 and the hardened dielectric 230 are removed so that an upper surface 232 of the original sacrificial dielectric material 226 is exposed.

In various embodiments, such an opening may be created using any suitable technique which would depend on the type of the shell material (and on the type of the hardened dielectric material, in case such a material was formed). In some embodiments, such an opening may be created by gently polishing off the upper portions of the shell material (and in the hardened dielectric material, in case such a material was formed) until the upper surface 232 of the sacrificial dielectric 226 is exposed. Additionally or alternatively, in some embodiments, dry etch with e.g. chlorine (Cl2) and boron trichloride (BCl3) chemistry in reactive ion etch (RIE) process may be used to form an etch/deposition opening in the process 106.

Figure 2D:
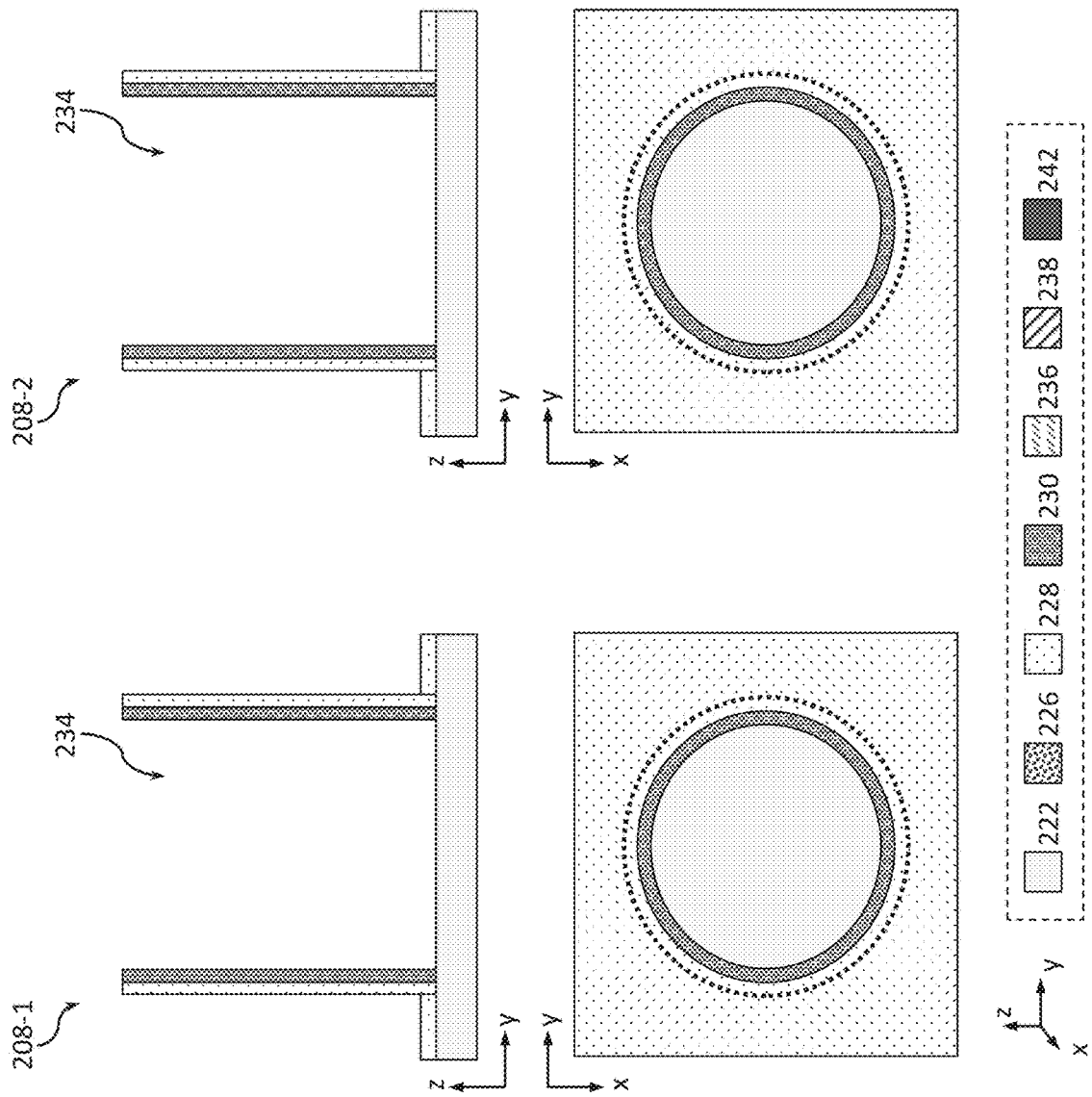

Next, the method 100 may proceed with a process 108 of etching, via the opening created in the process 106, at least some of the sacrificial dielectric material 226 to form a cavity. An exemplary result of the process 108 is illustrated in FIG. 2D with a device assembly 208-1 for the first embodiment and a device assembly 208-2 for the second embodiment, in each of which showing all of the sacrificial dielectric material 226 removed to form a cavity 234 in the shell material 228 and the hardened dielectric 230. In other embodiments (not specifically shown in FIGS.), some of the sacrificial dielectric material 226 may remain in the cavity 234, e.g. on the sidewalls of the cavity 234.

Any suitable etching techniques for removing the sacrificial dielectric material 226 without substantially removing the shell material 228 or the hardened dielectric 230 may be used in the process 108. In some embodiments, the etch of the process 108 may advantageously include an isotropic etch (i.e. a process that etches in multiple directions, both vertically and horizontally), such as e.g. an isotropic wet etch. Any substance suitable for isotropically etching the sacrificial material 226 may be used in the process 108. In various embodiments, an etchant may be e.g. corrosive liquid, such as e.g. hydrofluoric acid (HF) or a chemically active ionized gas (i.e. plasma).

Provided that substantially all of the sacrificial material 226 is etched out in the process 108, the shape and dimensions of the resulting cavity 234 will be those defined by the shell 228 and the hardened dielectric 230. In some embodiments, the cavity 234 may have a height (i.e. a dimension measured along the z-axis of the coordinate system shown in FIGS. 2A-2H) between about 100 and 5000 nm, including all values and ranges therein, e.g. between about 200 and 3000 nm, or between about 500 and 2000 nm, and a width (i.e. a dimension measured along the y-axis of the coordinate system shown in FIGS. 2A-2H, for the cylindrical capacitors—the diameter of the cylindrical cavity) between about 5 and 50 nm, including all values and ranges therein, e.g. between about 10 and 40 nm, or between about 20 and 30 nm.

Figure 2E:
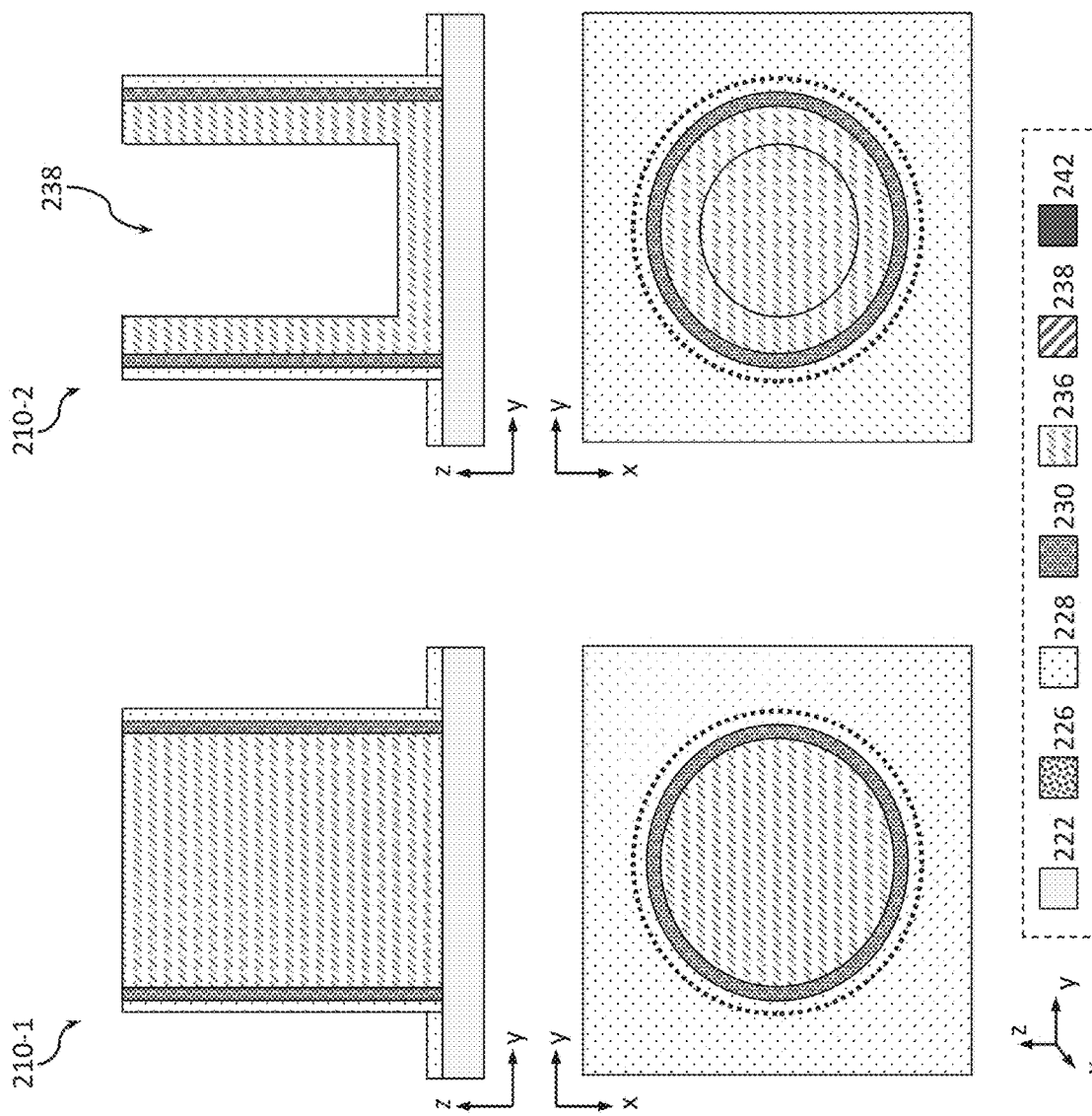

The method 100 may then proceed with a process 110 of providing the first of the two capacitor electrodes within the cavity formed in the process 108. An exemplary result of the process 110 is illustrated in FIG. 2E with a device assembly 210-1 for the first embodiment and a device assembly 210-2 for the second embodiment. Each of the first and second embodiments shown in FIG. 2E illustrate that an electrically conductive material 236 is deposited within the cavity 234 to form the first electrode, however, the first and second embodiments differ in the geometry of such an electrode. Namely, according to the first embodiment, the first electrode occupies substantially the entire cavity 234, while the first electrode according to the second embodiment is provided only along the inner sidewalls and bottom of the cavity 234, leaving a smaller cavity 238 (shown in the device assembly 210-2) substantially in the center of the cavity 234 that was formed in the process 108. In other words, the first electrode according to the second embodiment is provided as a conformal liner of the electrically conductive material 236 on the inner sidewalls and bottom of the cavity 234.

Thus, for the first embodiment shown with the device assembly 210-1, the first electrode of the conductive material 236 has substantially the shape of the original 3D structure 224, but of slightly smaller dimensions when the hardened dielectric layer 230 is present. Such an electrode may be formed using any suitable techniques for uniformly depositing conductive materials into openings, such as e.g. ALD, CVD, PECVD, or/and PVD processes such as e.g. sputter.

On the other hand, for the second embodiment shown with the device assembly 210-2, a thickness of the first capacitor electrode of the conductive material 236 (i.e. a dimension measured along the y-axis of the coordinate system shown in FIGS. 2A-2H) may be between about 5 and 50 nm, including all values and ranges therein, e.g. between about 10 and 40 nm, or between about 20 and 30 nm. Such an electrode may be formed using any suitable techniques for conformally depositing conductive materials onto selected surfaces, such as e.g. ALD, CVD, PECVD, or/and PVD processes such as e.g. sputter.

The differences in the shape of the first electrode provided in the process 110 according to the first and second embodiments are due to the differences of the final non-planar capacitors fabricated using the cavity fill method as described herein, which differences are described in greater detail below with reference to both capacitor electrodes as well as a capacitor insulator f such capacitors.

Figure 2F:
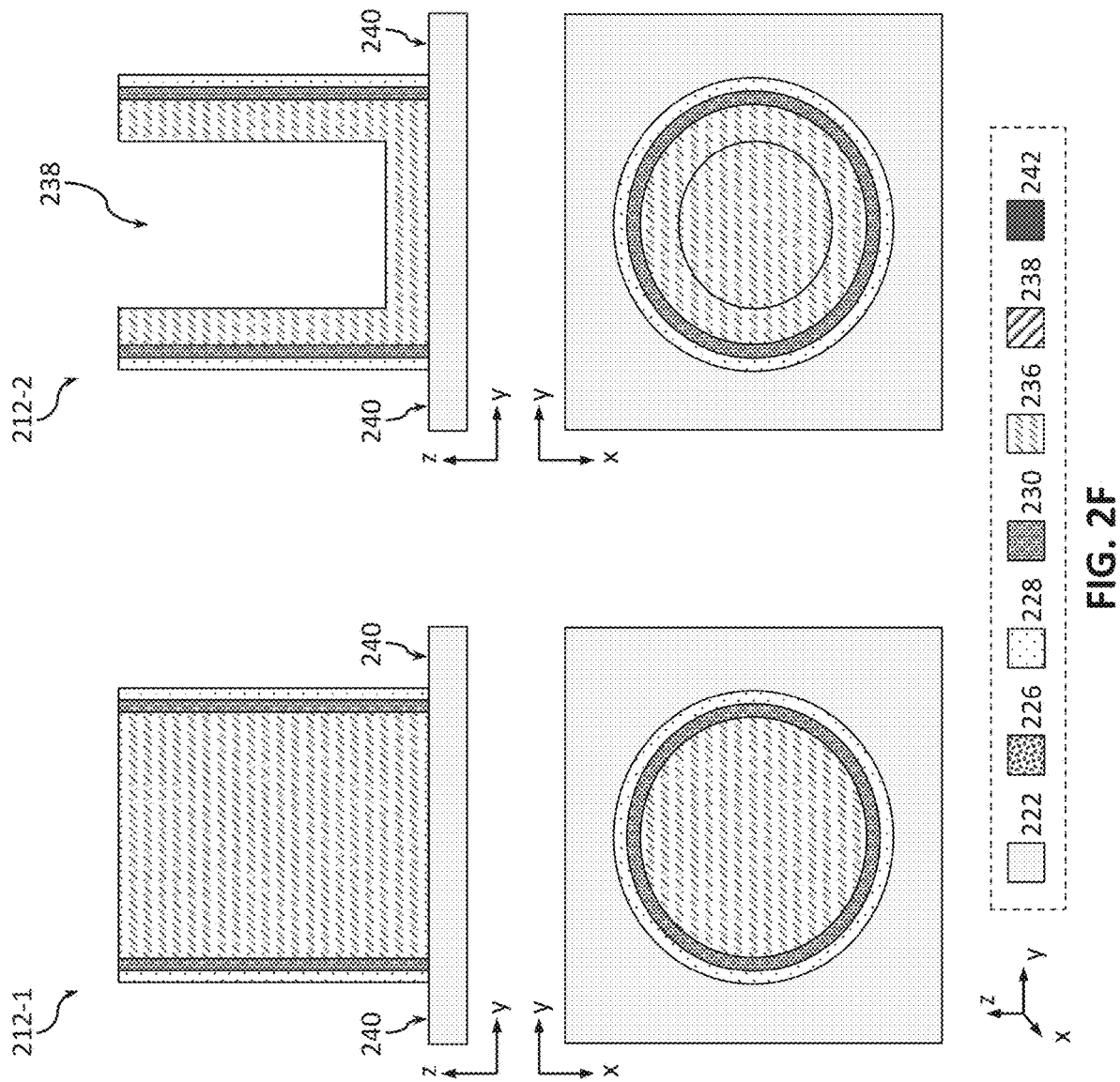

Turning back to the method 100, a process 112 may include an optional process of removing the excess of the shell material deposited on surfaces besides the surfaces of the 3D structure 224 (i.e. on the horizontal surfaces of the substrate) as a part of the process 104. An exemplary result of the process 112 is illustrated in FIG. 2F with a device assembly 212-1 for the first embodiment and a device assembly 212-2 for the second embodiment, illustrating that the shell material 228 is removed from the surfaces 240 of the substrate 222. While the process 112 is shown in FIG. 1 and in the illustrations of FIGS. 2A-2H as following the process 110, in other embodiments, the process 112 may be performed at any time before the process 110 from the time the process 104 has been performed (i.e. at any time after the shell material 228 is deposited). In various embodiments, removing the excess shell material 228 to expose the surfaces 240 may be performed by e.g. a wet etch process, e.g. using hydrofluoric acid (HF).

The process 112 is described herein as optional because, in some embodiments, the shell material 228 may be left on the surfaces 240 of the substrate 222 and the method 100 may continue with such surfaces. In such embodiments, FIGS. 2G-2H would be modified accordingly to still show the shell material 228 on the surfaces 240 (as in FIG. 2E), all of which embodiments are within the scope of the present disclosure. Another reason the process 112 is optional is that, in some embodiments, deposition of the shell material 228 in the process 104 may be such that the excess of the shell material 228 is not left on the surfaces 240 of the substrate 222, e.g. because such surfaces are masked prior to depositing the shell material 228 in the process 104. In such embodiments, FIGS. 2B-2E would be modified accordingly to not have the shell material 228 on the surfaces 240 (as in FIG. 2F), all of which embodiments are within the scope of the present disclosure.

Figure 2G:
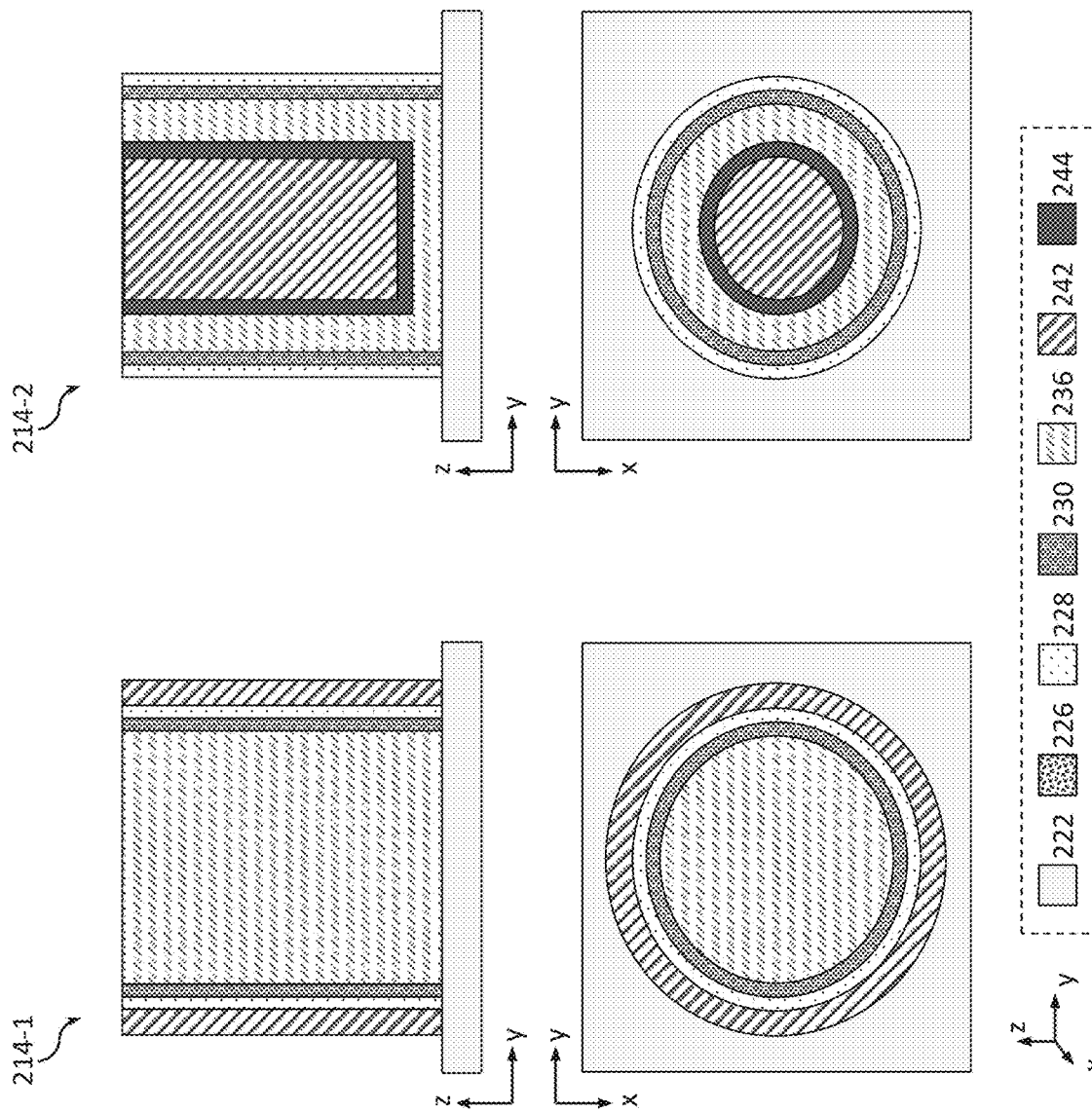

The method 100 may then proceed with a process 114 of providing the second of the two capacitor electrodes, the second electrode separated from the first electrode formed in the process 110 by a capacitor insulator. An exemplary result of the process 114 is illustrated in FIG. 2G with a device assembly 214-1 for the first embodiment and a device assembly 214-2 for the second embodiment. Each of the first and second embodiments shown in FIG. 2G illustrate that an electrically conductive material 242 is deposited to form the second electrode, however, the first and second embodiments differ in the geometry of such an electrode due to the differences of the final non-planar capacitors fabricated using the cavity fill method as described herein (and due to the differences in the geometry of the first electrode).

Namely, for the first embodiment, as shown with the device assembly 214-1, the first electrode 236 (i.e. the electrode made of the electrically conductive material 236) is an inner electrode of a non-planar capacitor, the second electrode 242 (i.e. the electrode made of the electrically conductive material 242) is an outer electrode of the non-planar capacitor (because the second electrode 242 encompasses the first electrode 236 in such an embodiment), while the shell material 228 as well as the hardened dielectric 230, in case such material layer is present, form the capacitor insulator of the non-planar capacitor. On the other hand, for the second embodiment, as shown with the device assembly 214-2, the first electrode 236 is an outer electrode of a non-planar capacitor, the second electrode 242 is an inner electrode of the non-planar capacitor (because the first electrode 236 encompasses the second electrode 242 in such an embodiment), while another material 244 is provided as the capacitor insulator. In such an embodiment, the shell material 228 as well as the hardened dielectric 230, in case such material layer is present, just serve to form a cavity inside which the entire non-planar capacitor is provided and do not serve as the capacitor insulator materials as in the first embodiment.

Turning to the details of the first embodiment, as shown with the device assembly 214-1 in FIG. 2G, the capacitor insulator may be a dielectric stack of the shell material 228 that includes aluminum and nitrogen (e.g. AlN) and the hardened dielectric 230. Such a capacitor insulator is provided between, and may be in contact with, on each respective side, the first (inner) electrode 236 and the second (outer) electrode 242. Thus, the second electrode 242 encompasses and may be in contact with the shell material 228, the shell material 228 encompasses and may be in contact with the hardened dielectric 230, and the hardened dielectric 230 encompasses and may be in contact with the first electrode 236. In such an embodiment, a surface area of a transverse cross-section of the first capacitor electrode 236 (i.e. the dimension measured in the x-y plane of the coordinate system shown in FIGS. 2A-2H) may be between about 25 and 2500 square nm (nm2), including all values and ranges therein, e.g. between about 100 and 1600 nm2, or between about 400 and 900 nm2. For example, for a cylindrical capacitor where the first capacitor electrode 236 is the core of the cylindrical structure, a diameter of the first capacitor electrode 236 may be between about 5 and 55 nm, including all values and ranges therein, e.g. between about 11 and 45 nm, or between about 12 and 34 nm. In another example, for a square prism capacitor where the first capacitor electrode 236 is the core of the square prism structure, a side length of the square that forms the first capacitor electrode 236 may be between about 5 and 50 nm, including all values and ranges therein, e.g. between about 10 and 40 nm, or between about 20 and 30 nm. In different variations of the first embodiment, a thickness of the second capacitor electrode 242 may be between about 5 and 50 nm, including all values and ranges therein, e.g. between about 10 and 40 nm, or between about 20 and 30 nm.

In the first embodiment, the second capacitor electrode 242 may be fabricated using any of the conformal deposition techniques described above, such as e.g. ALD, CVD, PECVD, or/and PVD processes such as e.g. sputter, so that the electrically conductive material 242 is provided substantially only on the outer sidewalls of the shell material 228 structure.

Turning to the details of the second embodiment, as shown with the device assembly 214-2 in FIG. 2G, the capacitor insulator 244 may be provided conformally on the inner sidewalls and the bottom of the cavity 238 (e.g. as a liner lining the inner sidewalls of the cavity 238), and the second capacitor electrode 242 is subsequently provided to fill the remaining open volume of the cavity (i.e. remaining volume after the deposition of a liner of the capacitor insulator 244). Thus, in this embodiment, the capacitor insulator 244 is still provided between, and may be in contact with, on each respective side, the first electrode 236 and the second electrode 242, as in the first embodiment, but now the first electrode 236 encompasses and may be in contact with the capacitor insulator 244, and the capacitor insulator 244 encompasses and may be in contact with the second electrode 242. In such an embodiment, a thickness of the capacitor insulator 244 may be between about 2 and 15 nm, including all values and ranges therein, e.g. between about 3 and 10 nm, or between about 5 and 8 nm, while a surface area of a transverse cross-section of the second capacitor electrode 242 (i.e. the dimension measured in the x-y plane of the coordinate system shown in FIGS. 2A-2H) may be between about 25 and 1600 nm2, including all values and ranges therein, e.g. between about 100 and 1600 nm2, or between about 400 and 900 nm2. For example, for a cylindrical capacitor where the second capacitor electrode 242 is the core of the cylindrical structure, a diameter of the second capacitor electrode may be between about 5 and 45 nm, including all values and ranges therein, e.g. between about 11 and 34 nm. In another example, for a square prism capacitor where the second capacitor electrode 242 is the core of the square prism structure, a side length of the square that forms the second capacitor electrode 242 may be between about 10 and 40 nm, including all values and ranges therein, e.g. between about 20 and 30 nm.

Since the non-planar capacitor formed according to the second embodiment as shown with the device assembly 214-2 of FIG. 2G includes a designated layer of a material serving as the capacitor insulator 244, such a capacitor may be fabricated as a ferroelectric capacitor, as e.g. used in certain memory applications. In such embodiments, the capacitor insulator 244 would include one or more thin-film ferroelectric materials (i.e. materials exhibiting ferroelectric behavior at thin dimensions), such as e.g. hafnium zirconium oxide (HfZrO, also referred to as HZO, i.e. a material which includes hafnium, zirconium, and oxygen), silicon-doped (Si-doped) hafnium oxide (i.e. a material that includes hafnium, oxygen, and silicon), germanium-doped (Ge-doped) hafnium oxide (i.e. a material that includes hafnium, oxygen, and germanium), aluminum-doped (Al-doped) hafnium oxide (i.e. a material that includes hafnium, oxygen, and aluminum), and yttrium-doped (Y-doped) hafnium oxide (i.e. a material that includes hafnium, oxygen, and yttrium).

In case the non-planar capacitor of the second embodiment is not ferroelectric, the capacitor insulator 244 may include any of the known dielectric materials which do not exhibit ferroelectric behavior, such as e.g. any of the high-k dielectric materials including elements such as hafnium, silicon, oxygen, titanium, tantalum, lanthanum, aluminum, zirconium, barium, strontium, yttrium, lead, scandium, niobium, and zinc. Examples of high-k materials that may be used in the capacitor insulator 244 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the capacitor insulator 244 during manufacture of the non-planar capacitor of the device assembly 214-2 to improve the quality of the capacitor insulator 244.

In the second embodiment, the capacitor insulator 244 may be fabricated using any of suitable conformal deposition techniques for depositing the material of the capacitor insulator, such as e.g. ALD, CVD, PECVD, or/and PVD processes such as e.g. sputter, so that the capacitor insulator 244 is provided substantially only on the inner sidewalls of the cavity formed by the first electrode 236. The second capacitor electrode 242 may then be fabricated using any of the fill deposition techniques described above, such as e.g. ALD, CVD, PECVD, or/and PVD processes such as e.g. sputter, so that the electrically conductive material 242 fills the cavity defined by the capacitor insulator 244.

In various embodiments, the electrically conductive material 242 of the second electrode could be the same or different material as the electrically conductive material 236 of the first electrode. In general, in various embodiments, each of the electrically conductive materials described herein, e.g. the electrically conductive materials 236 and 242, may include any suitable electrically conductive material, alloy, or a stack of multiple electrically conductive materials. In some embodiments, various electrically conductive materials described herein may include one or more metals or metal alloys, with metals such as e.g. ruthenium, palladium, platinum, cobalt, nickel, hafnium, zirconium, titanium, tantalum, and aluminum. In some embodiments, various electrically conductive materials described herein may include one or more electrically conductive alloys, oxides (i.e. conductive metal oxides), carbides (e.g., hafnium carbide, zirconium carbide, titanium carbide, tantalum carbide, and aluminum carbide), or nitrides (e.g. hafnium nitride, zirconium nitride, titanium nitride, tantalum nitride, and aluminum nitride) of one or more metals.

Only for the second embodiment shown in FIGS. 2A-2H, the method 100 may then proceed with a process 116 of removing the shell material. The hardened dielectric 230 may be removed as well. An exemplary result of the process 116 is illustrated in FIG. 2H with a device assembly 216-2 for the second embodiment illustrating that the shell material 228 and the hardened dielectric 230 have been removed. In various embodiments, the shell material 228 and the hardened dielectric 230 may be removed using wet etch, dry etch, or a suitable combination of wet etch and dry etch. For example, a wet etch can be performed using potassium hydroxide (KOH), tetramethylammonium hydroxide (TMAH) or hydrofluoric acid (HF) based chemistries, while dry etch can be performed using chlorine gas (e.g. Cl2), and boron trichloride (BCl3) type chemistries in RIE.

In various embodiments, the non-planar capacitors according to any of the embodiments described herein, e.g. the non-planar capacitor of the device assembly 214-1 shown in FIG. 2G, the non-planar capacitor of the device assembly 214-2 shown in FIG. 2G, or the non-planar capacitor of the device assembly 216-2 shown in FIG. 2H may have an AR (i.e. a ratio of a height of the capacitor and the largest transverse dimension of the capacitor) that is higher than about 10, e.g. higher than 15 or higher than 20.

In some embodiments, the final non-planar capacitors according to any of the embodiments described herein, e.g. the non-planar capacitor of the device assembly 214-1 shown in FIG. 2G, the non-planar capacitor of the device assembly 214-2 shown in FIG. 2G, or the non-planar capacitor of the device assembly 216-2 shown in FIG. 2H may be surrounded by a gate spacer, not specifically shown in FIGS. 2G and 2H, configured to provide separation between the different capacitors and/or between the non-planar capacitor and other IC components disposed in the vicinity of the non-planar capacitor. Such a spacer may be made of a low-k dielectric material (i.e. a dielectric material that has a lower dielectric constant (k) than silicon dioxide). Examples of low-k materials that may be used in such a dielectric spacer may include, but are not limited to, fluorine-doped silicon dioxide, carbon-doped silicon dioxide, spin-on organic polymeric dielectrics such as e.g. polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

The device assemblies illustrated in FIGS. 2A-2H do not represent an exhaustive set of assemblies in which non-planar capacitors formed using a cavity fill method as described herein may be implemented, but merely provide examples of such structures/assemblies. Although particular arrangements of materials are discussed with reference to FIGS. 2A-2H, intermediate materials may be included in the assemblies of these FIGS. Note that FIGS. 2A-2H are intended to show relative arrangements of the elements therein, and that device assemblies of these FIGS. may include other elements that are not specifically illustrated (e.g., various interfacial layers). Additionally, although some elements of the device assemblies are illustrated in FIGS. 2A-2H as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g. optical microscopy, TEM, or SEM, and/or inspection of a cross-section of a device to detect the shape and the location of various device elements described herein using e.g. Physical Failure Analysis (PFA) would allow determination of the non-planar capacitors formed using a cavity fill method as described herein.

The device assemblies having one or more non-planar capacitors formed via cavity fill as disclosed herein may be included in any suitable electronic device. FIGS. 3A-6 illustrate various examples of apparatuses that may include one or more device assemblies implementing non-planar capacitors formed using a cavity fill method, as disclosed herein.

FIGS. 3A-3B are top views of a wafer 2000 and dies 2002 that may include one or more non-planar capacitors formed using the cavity fill method in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more non-planar capacitors as shown e.g. in the device assemblies 214-1, 214-2, or 216-2, or any other components where non-planar capacitors may be formed using a cavity fill method as described herein). After the fabrication of the semiconductor product is complete (e.g., after manufacture of one or more device assemblies 214-1, 214-2, or 216-2, or any other components where non-planar capacitors may be formed using a cavity fill method as described herein), the wafer 2000 may undergo a singulation process in which each of the dies 2002 is separated from one another to provide discrete "chips" of the semiconductor product. In particular, devices that include one or more semiconductor device assemblies implementing non-planar capacitors formed using a cavity fill method as disclosed herein may take the form of the wafer 2000 (e.g., not singulated) or the form of the die 2002 (e.g., singulated). The die 2002 may include one or more transistors (e.g., one or more of the transistors 2140 of FIG. 4, discussed below), and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2302 of FIG. 6) or other logic that is configured to store information in the memory devices or execute instructions stored in the memory array.

Figure 4:
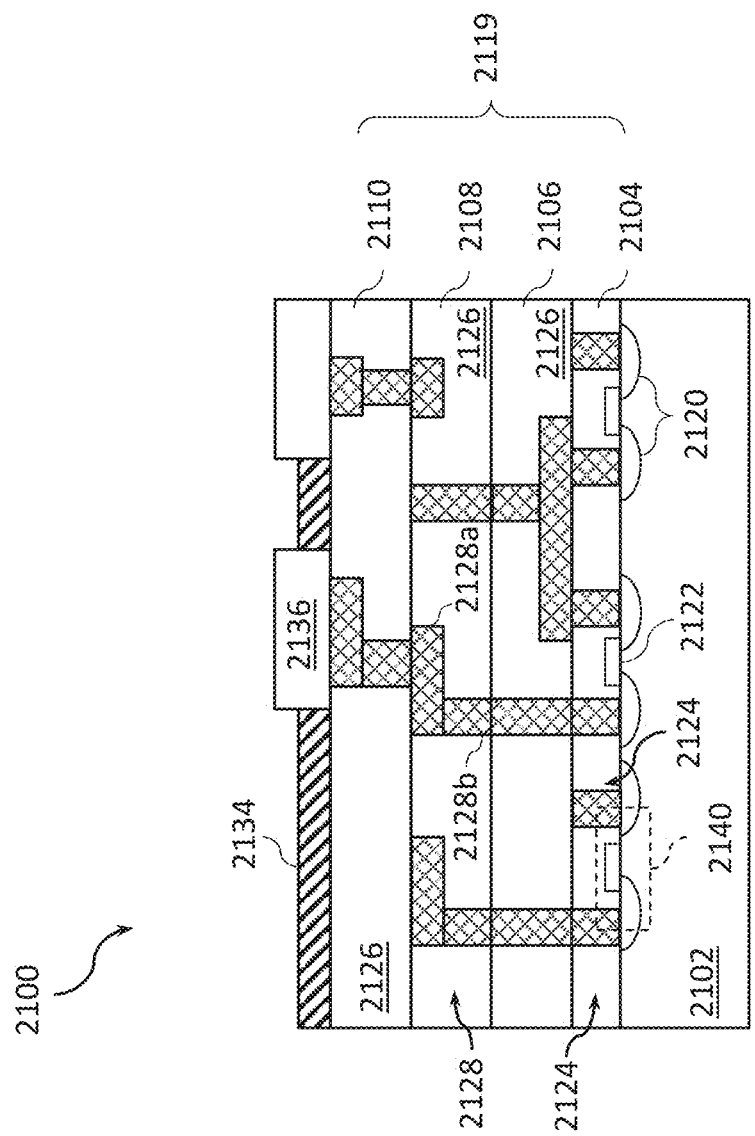
FIG. 4 is a cross-sectional side view of an integrated circuit (IC) device that may include one or more non-planar capacitors formed using the cavity fill method in accordance with any of the embodiments disclosed herein.

FIG. 4 is a cross-sectional side view of an IC device 2100 that may include one or more non-planar capacitors formed using the cavity fill method in accordance with any of the embodiments disclosed herein. The IC device 2100 may be formed on a substrate 2102 (e.g., the wafer 2000 of FIG. 3A) and may be included in a die (e.g., the die 2002 of FIG. 3B). The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator substructure. In some embodiments, the semiconductor substrate 2102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 2102. Although a few examples of materials from which the substrate 2102 may be formed are described here, any material that may serve as a foundation for an IC device 2100 may be used. The substrate 2102 may be part of a singulated die (e.g., the dies 2002 of FIG. 3B) or a wafer (e.g., the wafer 2000 of FIG. 3A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. Although not specifically shown in FIG. 4, the IC device may implement non-planar capacitors formed using a cavity fill method as described herein, e.g. as described with reference to the device assemblies 214-216. The S/D regions 2120 may be formed either adjacent to or at a distance from the gate 2122 of each transistor 2140, using any suitable processes known in the art, some of which are described above. The transistors 2140 may include additional features not depicted for the sake of clarity, such as additional device isolation regions, gate contacts, and the like. The transistors 2140 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or FinFETs, and wrap-around or all-around gate transistors, such as nanoribbon and nanowire transistors.

Each transistor 2140 may include a gate 2122 formed of at least two layers, a gate dielectric layer and a gate electrode layer.

The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some embodiments, when viewed as a cross-section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate (e.g., in a FinFET). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

Electrical signals, such as power and/or input/output (I/O) signals, may be routed to and/or from the transistors 2140 of the device layer 2104 through one or more interconnect layers disposed on the device layer 2104 (illustrated in FIG. 4 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 4). Although a particular number of interconnect layers 2106-2210 is depicted in FIG. 4, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 4. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 4. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 5:
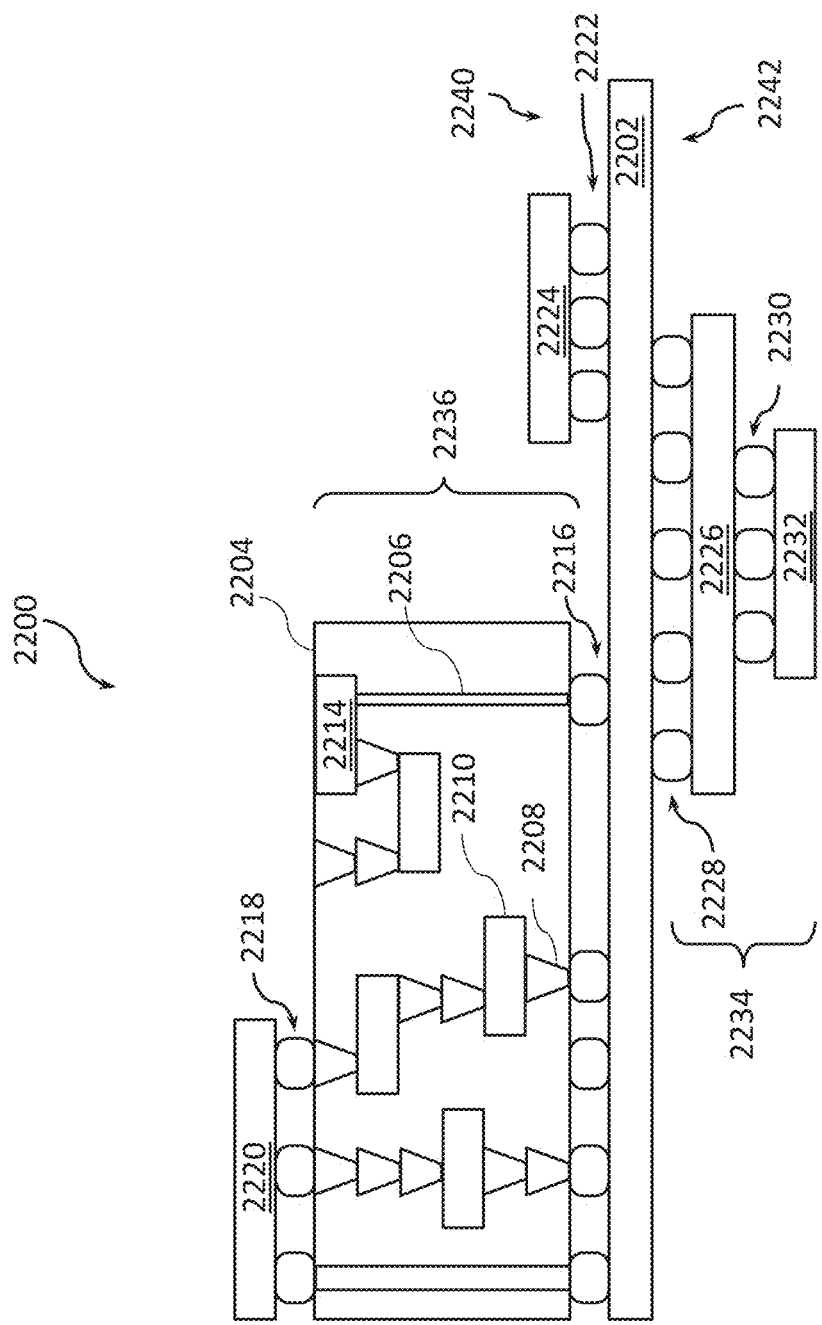
FIG. 5 is a cross-sectional side view of an IC device assembly that may include one or more non-planar capacitors formed using the cavity fill method in accordance with any of the embodiments disclosed herein.

FIG. 5 is a cross-sectional side view of an IC device assembly 2200 that may include one or more non-planar capacitors formed using the cavity fill method in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the semiconductor device assemblies implementing non-planar capacitors formed using a cavity fill method in accordance with any of the embodiments disclosed herein.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 5 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 5), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 5, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 3B), an IC device (e.g., the IC device 2100 of FIG. 4), or any other suitable component. Generally, the interposer 2204 may spread a connection to a wider pitch or reroute a connection to a different connection. For example, the interposer 2204 may couple the IC package 2220 (e.g., a die) to a ball grid array (BGA) of the coupling components 2216 for coupling to the circuit board 2202. In the embodiment illustrated in FIG. 5, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

The IC device assembly 2200 illustrated in FIG. 5 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 6:
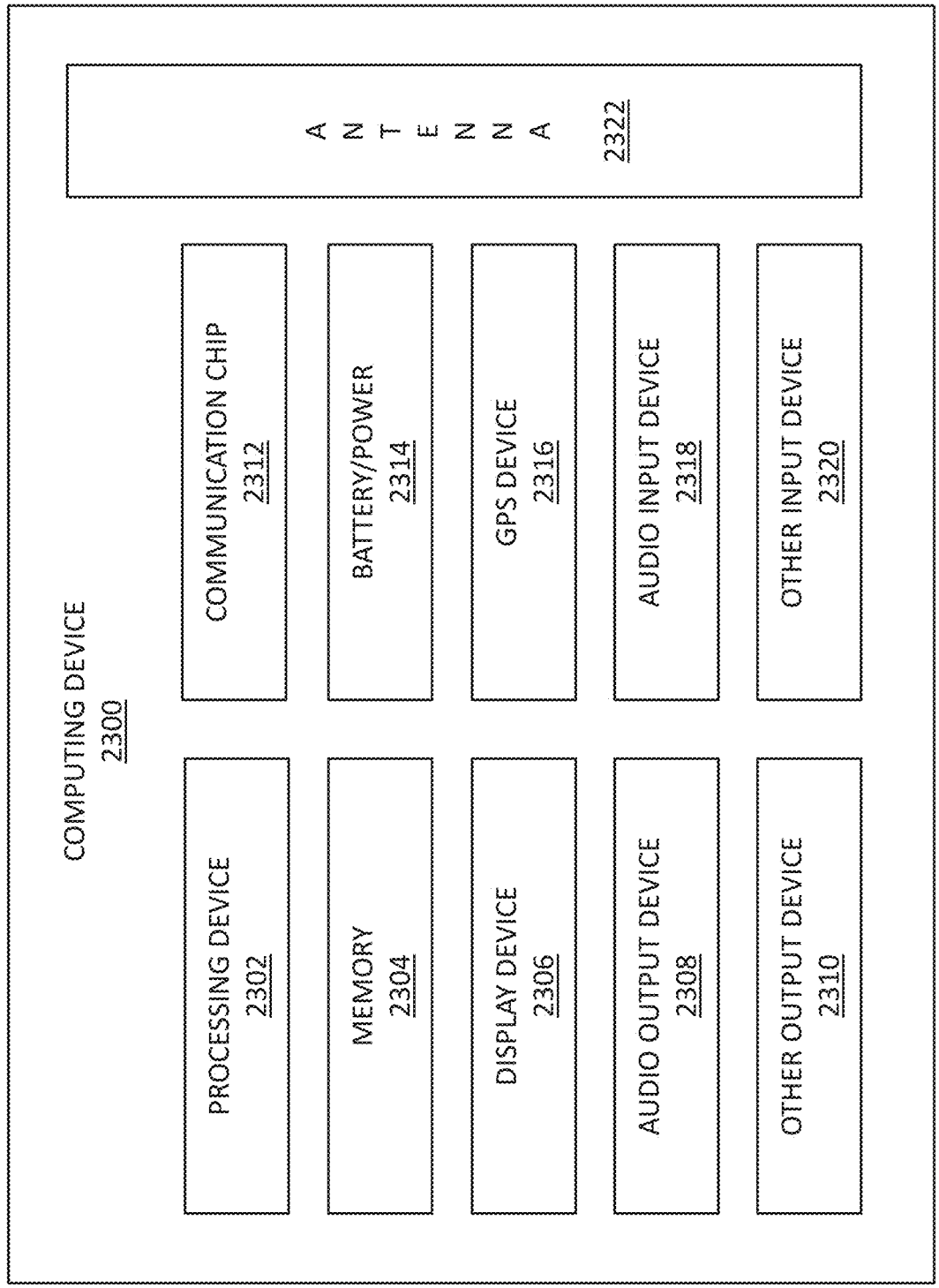
FIG. 6 is a block diagram of an example computing device that may include one or more non-planar capacitors formed using the cavity fill method in accordance with any of the embodiments disclosed herein.

FIG. 6 is a block diagram of an example computing device 2300 that may include one or more non-planar capacitors formed using the cavity fill method in accordance with any of the embodiments disclosed herein. For example, any suitable ones of the components of the computing device 2300 may include a die (e.g., the die 2002 shown in FIG. 3B) having device components, such as e.g. memory devices or RF power amplifiers, which use non-planar capacitors formed using a cavity fill method in accordance with any of the embodiments disclosed herein. Any one or more of the components of the computing device 2300 may include, or be included in, an IC device 2100 (FIG. 4). Any one or more of the components of the computing device 2300 may include, or be included in, an IC device assembly 2200 (FIG. 5).

A number of components are illustrated in FIG. 6 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single System-on-a-Chip (SoC) die.

Additionally, in various embodiments, the computing device 2300 may not include one or more of the components illustrated in FIG. 6, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-M RAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include a GPS device 2316 (or corresponding interface circuitry, as discussed above). The GPS device 2316 may be in communication with a satellite-based system and may receive a location of the computing device 2300, as known in the art.

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

The following paragraphs provide various examples of the embodiments disclosed herein.

Example 1 provides a device assembly that includes a substrate and a non-planar capacitor provided over the substrate. The non-planar capacitor includes a first capacitor electrode, a second capacitor electrode, and a capacitor insulator between the first and second capacitor electrodes.

At least one of the first and second capacitor electrodes is shaped as a cylinder or a prism extending away from the substrate and being substantially perpendicular to the substrate, and the first capacitor electrode is at least partially encompassed (i.e. surrounded) by a dielectric stack including a layer of a first dielectric material (e.g. the hardened dielectric material as described herein) and a layer of a second dielectric material, different from the first dielectric material, the second dielectric material including (e.g. being a compound of) aluminum and nitrogen, e.g. the second dielectric material including (or being) AlN.

Example 2 provides the device assembly according to Example 1, where the first capacitor electrode is an inner electrode and the second capacitor electrode is an outer electrode.

Example 3 provides the device assembly according to Example 2, where the dielectric stack is the capacitor insulator of the non-planar capacitor.

Example 4 provides the device assembly according to Examples 2 or 3, where the second capacitor electrode (i.e. the outer electrode in this embodiment) at least partially encompasses (i.e. surrounds) the dielectric stack.

Example 5 provides the device assembly according to any one of Examples 2-4, where the second capacitor electrode (i.e. the outer electrode in this embodiment) is in contact with the second dielectric material (i.e. material including aluminum and nitrogen) of the dielectric stack.

Example 6 provides the device assembly according to any one of Examples 2-5, where a surface area of a transverse cross-section of the first capacitor electrode (i.e. the inner electrode in this embodiment) is between about 25 and 2500 nm$^2$, including all values and ranges therein, e.g. between about 100 and 1600 nm$^2$, or between about 400 and 900 nm$^2$.

Example 7 provides the device assembly according to any one of Examples 2-6, where a thickness of the second capacitor electrode (i.e. the outer electrode in this embodiment) is between about 5 and 50 nm, including all values and ranges therein, e.g. between about 10 and 40 nm, or between about 20 and 30 nm.

Example 8 provides the device assembly according to Example 1, where the first capacitor electrode is an outer electrode and the second capacitor electrode is an inner electrode.

Example 9 provides the device assembly according to Example 8, where the first capacitor electrode (i.e. the outer electrode in this embodiment) at least partially encompasses (i.e. surrounds) the second capacitor electrode (i.e. the inner electrode in this embodiment).

Example 10 provides the device assembly according to Examples 8 or 9, where the first capacitor electrode (i.e. the outer electrode in this embodiment) at least partially encompasses (i.e. surrounds) the capacitor insulator, and the capacitor insulator at least partially encompasses (i.e. surrounds) the second capacitor electrode (i.e. the inner electrode in this embodiment).

Example 11 provides the device assembly according to any one of Examples 8-10, where the capacitor insulator includes a high-k dielectric material, such as e.g. hafnium oxide.

Example 12 provides the device assembly according to any one of Examples 8-10, where the capacitor insulator includes a thin-film ferroelectric material, such as e.g. one or more of hafnium zirconium oxide, silicon-doped hafnium oxide, germanium-doped hafnium oxide, aluminum-doped hafnium oxide, and yttrium-doped hafnium oxide.

Example 13 provides the device assembly according to any one of Examples 8-12, where a thickness of the capacitor insulator is between about 2 and 15 nm, including all values and ranges therein, e.g. between about 3 and 10 nm, or between about 5 and 8 nm.

Example 14 provides the device assembly according to any one of Examples 8-13, where the first capacitor electrode (i.e. the outer electrode in this embodiment) is in contact with the capacitor insulator.

Example 15 provides the device assembly according to any one of Examples 8-14, where the second capacitor electrode (i.e. the inner electrode in this embodiment) is in contact with the capacitor insulator.

Example 16 provides the device assembly according to any one of Examples 8-15, where a surface area of a transverse cross-section of the second capacitor electrode (i.e. the inner electrode in this embodiment) is between about 25 and 1600 nm$^2$, including all values and ranges therein, e.g. between about 100 and 1600 nm$^2$, or between about 400 and 900 nm$^2$.

Example 17 provides the device assembly according to any one of Examples 8-16, where a thickness of the first capacitor electrode (i.e. the outer electrode in this embodiment) is between about 5 and 50 nm, including all values and ranges therein, e.g. between about 10 and 40 nm, or between about 20 and 30 nm.

Example 18 provides the device assembly according to any one of the preceding Examples, where the first capacitor electrode is in contact with the first dielectric material (i.e. the hardened dielectric material) of the dielectric stack.

Example 19 provides the device assembly according to any one of the preceding Examples, where the first dielectric material (i.e. the hardened dielectric material) of the dielectric stack is in contact with the second dielectric material (i.e. the material including aluminum and nitrogen) of the dielectric stack.

Example 20 provides the device assembly according to any one of the preceding Examples, where the first dielectric material (i.e. the hardened dielectric material) includes one or more of: a compound including silicon and oxygen (e.g. SiO2), a compound including silicon and nitrogen (e.g. SiN), a compound including silicon, oxygen, and nitrogen (e.g. SiON), a compound including aluminum and oxygen (e.g. Al2O3), a compound including hafnium and oxygen (e.g. HfO2), and a compound including aluminum, hafnium, and oxygen (e.g. AlHfO).

Example 21 provides the device assembly according to any one of the preceding Examples, where a thickness of the layer of the first dielectric material (i.e. the hardened dielectric material) is between about 5 and 100 nm, e.g. between 10 and 30 nm, or between 15 and 20 nm.

Example 22 provides the device assembly according to any one of the preceding Examples, where a thickness of the layer of the second dielectric material (i.e. the material including aluminum and nitrogen) is between 5 and 100 nm, e.g. between 20 and 80 nm, or between 50 and 75 nm.

Example 23 provides the device assembly according to any one of the preceding Examples, where an aspect ratio of the non-planar capacitor (i.e. a ratio of a height of the capacitor and the largest transverse dimension of the capacitor) is higher than about 10, e.g. higher than 15 or higher than 20.

Example 24 provides a method of fabricating a device assembly with a non-planar capacitor. The method includes providing a three-dimensional structure of a sacrificial material over a substrate; at least partially enclosing the structure with a shell material; forming a cavity in the shell material by removing at least a portion of the sacrificial material through a first opening in the shell material; and providing a first capacitor electrode and a second capacitor electrode. The first capacitor electrode is within the cavity, and the first capacitor electrode and the second capacitor electrode are separated by a capacitor insulator.

Example 25 provides the method according to Example 24, where the first capacitor electrode is an inner electrode and the second capacitor electrode is an outer electrode of the non-planar capacitor.

Example 26 provides the method according to Example 25, where providing the first and second capacitor electrodes includes filling the cavity with a first capacitor electrode material; and at least partially encompassing (i.e. surrounding) the cavity with a second capacitor electrode material.

Example 27 provides the method according to Example 26, where the shell material forms at least a part of the capacitor insulator.

Example 28 provides the method according to any one of Examples 25-27, where a surface area of a transverse cross-section of the first capacitor electrode (i.e. the inner electrode in this embodiment) is between about 25 and 2500 $nm^2$.

Example 29 provides the method according to any one of Examples 25-28, where a thickness of the second capacitor electrode (i.e. the outer electrode in this embodiment) is between about 5 and 50 nm.

Example 30 provides the method according to Example 24, where the first capacitor electrode is an outer electrode and the second capacitor electrode is an inner electrode.

Example 31 provides the method according to Example 30, where providing the first and second capacitor electrodes includes lining an inner surface of the cavity with a first capacitor electrode material; lining a surface of first capacitor electrode material within the cavity with a capacitor insulator material; and depositing a second capacitor electrode material in an opening at least partially encompassed (i.e. surrounded) by the capacitor insulator material.

Example 32 provides the method according to Examples 30 or 31, where the capacitor insulator includes a high-k dielectric material.

Example 33 provides the method according to Examples 30 or 31, where the capacitor insulator includes a thin-film ferroelectric material.

Example 34 provides the method according to any one of Examples 30-33, where a thickness of the capacitor insulator is between about 2 and 15 nm.

Example 35 provides the method according to any one of Examples 30-34, where a surface area of a transverse cross-section of the second capacitor electrode (i.e. the inner electrode in this embodiment) is between about 25 and 1600 $nm^2$.

Example 36 provides the method according to any one of Examples 30-35, where a thickness of the first capacitor electrode (i.e. the outer electrode in this embodiment) is between about 5 and 50 nm.

Example 37 provides the method according to any one of Examples 24-36, where the structure of the sacrificial material is a cylinder or a prism substantially perpendicular to the substrate.

Example 38 provides the method according to any one of Examples 24-37, where removing at least a portion of the sacrificial material includes performing a wet etch to remove the sacrificial material.

Example 39 provides the method according to any one of Examples 24-38, where the shell material includes a material that includes aluminum and nitrogen (e.g. AlN), and where at least partially enclosing the structure with the shell material includes performing MOCVD or sputtering.

In various further examples, Example provides the method according to any one of Examples 24-39 may be used to form Example provides the device assembly according to any one of Examples 1-23.

Example 40 provides a computing device that includes a carrier substrate and an IC die coupled to the carrier substrate. The IC die includes at least one non-planar capacitor including a first capacitor electrode, a second capacitor electrode, and a capacitor insulator between the first and second capacitor electrodes, where at least one of the first and second capacitor electrodes is shaped as a cylinder or a prism, and the first capacitor electrode is at least partially encompassed by a dielectric stack including a layer of a first dielectric material and a layer of a second dielectric material, the second dielectric material including aluminum and nitrogen, e.g. the second dielectric material including (or being) aluminum nitride.

Example 41 provides the computing device according to Example 40, where the computing device is a wearable or handheld computing device.

Example 42 provides the computing device according to Examples 40 or 41, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. An integrated circuit (IC) device, comprising:
 a support structure; and
 a non-planar capacitor over the support structure, the non-planar capacitor comprising a first capacitor electrode, a second capacitor electrode, and a capacitor insulator between the first capacitor electrode and the second capacitor electrode,
 wherein:
  the second capacitor electrode is a cylinder or a prism extending away from the support structure,
  the first capacitor electrode is at least partially surrounded by a dielectric stack comprising a layer of a first dielectric material and a layer of a second dielectric material,
  the second dielectric material is different from the first dielectric material and includes aluminum and nitrogen,
  the first capacitor electrode is an outer electrode, and the second capacitor electrode is an inner electrode.

2. The IC device according to claim 1, wherein the first capacitor electrode at least partially surrounds the second capacitor electrode.

3. The IC device according to claim 1, wherein the first capacitor electrode at least partially surrounds the capacitor insulator, and the capacitor insulator at least partially surrounds the second capacitor electrode.

4. The IC device according to claim 1, wherein the capacitor insulator includes a material having a dielectric constant that is higher than a dielectric constant of silicon oxide.

5. The IC device according to claim 1, wherein the capacitor insulator comprises a thin-film ferroelectric material.

6. The IC device according to claim 1, wherein a thickness of the capacitor insulator is between 2 and 15 nanometers.

7. The IC device according to claim 1, wherein the first capacitor electrode is in contact with the capacitor insulator.

8. The IC device according to claim 1, wherein the second capacitor electrode is in contact with the capacitor insulator.

9. The IC device according to claim 1, wherein a surface area of a transverse cross-section of the second capacitor electrode is between 25 and 1600 square nanometers.

10. The IC device according to claim 1, wherein a thickness of the first capacitor electrode is between 5 and 50 nanometers.

11. The IC device according to claim 1, wherein the first capacitor electrode is in contact with the first dielectric material of the dielectric stack.

12. The IC device according to claim 1, wherein the first dielectric material of the dielectric stack is in contact with the second dielectric material of the dielectric stack.

13. The IC device according to claim 1, wherein the first dielectric material is etch-selective with respect to the second dielectric material.

14. The IC device according to claim 1, wherein the first dielectric material has a dielectric constant that is lower than a dielectric constant of silicon oxide.

15. The IC device according to claim 1, wherein the first dielectric material includes silicon and oxygen.

16. The IC device according to claim 1, wherein an aspect ratio of the non-planar capacitor is higher than 10.

17. An integrated circuit (IC) device, comprising:
a non-planar capacitor, comprising a first capacitor electrode, a second capacitor electrode, and a capacitor insulator;
a layer of a first dielectric material; and
a layer of a second dielectric material,
wherein:
the second dielectric material is different from the first dielectric material and includes aluminum and nitrogen,
the second capacitor electrode is a cylinder or a prism,
the capacitor insulator is between a sidewall of the second capacitor electrode and the first capacitor electrode, and
the layer of the first dielectric material is between the first capacitor electrode and the layer of the second dielectric material.

18. The IC device according to claim 17, wherein the first dielectric material includes silicon and oxygen.

19. A device, comprising:
a carrier substrate; and
an integrated circuit (IC) die, coupled to the carrier substrate, the IC die including a capacitor having a first capacitor electrode, a second capacitor electrode, and a capacitor insulator, and further including a dielectric stack at least partially encompassing the capacitor,
wherein:
the dielectric stack includes a first dielectric material and a second dielectric material,
the second dielectric material is different from the first dielectric material and includes aluminum and nitrogen,
the second capacitor electrode is a cylinder or a prism,
the capacitor insulator is between a sidewall of the second capacitor electrode and the first capacitor electrode, and
the first capacitor electrode is between the capacitor insulator and the dielectric stack.

20. The device according to claim 19, wherein the device is a computing device.

* * * * *